United States Patent [19]

Kolm et al.

[11] Patent Number: 4,467,236

[45] Date of Patent: Aug. 21, 1984

[54] PIEZOELECTRIC ACOUSTO-ELECTRIC GENERATOR

[75] Inventors: Henry H. Kolm, Wayland; Eric A. Kolm, Brookline, both of Mass.

[73] Assignee: Piezo Electric Products, Inc., Cambridge, Mass.

[21] Appl. No.: 222,649

[22] Filed: Jan. 5, 1981

[51] Int. Cl.³ .................................... H01L 41/08
[52] U.S. Cl. .................... 310/321; 310/330; 310/331; 310/329; 310/339
[58] Field of Search ............... 310/330–332, 310/329, 321, 322, 324, 339; 84/DIG. 24, 383 R; 73/702, 704, 861.18, 861.19, 861.21, 861.22, 861.23, 861.24, 861.26

[56] References Cited

U.S. PATENT DOCUMENTS

| | | | |
|---|---|---|---|
| 2,509,913 | 5/1950 | Espenschied | 310/321 X |
| 2,769,867 | 11/1956 | Crownover et al. | 310/321 X |
| 2,808,522 | 10/1957 | Dranetz | 310/329 X |
| 2,809,520 | 10/1957 | Richard, Jr. | 73/861.24 X |
| 3,239,678 | 3/1966 | Kolm et al. | 310/322 X |
| 3,252,016 | 5/1966 | Hayer et al. | 310/329 |
| 3,336,529 | 8/1967 | Tygart | 310/330 X |
| 3,501,745 | 3/1970 | Beckman | 310/321 X |
| 3,600,612 | 8/1971 | Beeken | 73/861.21 X |
| 3,665,226 | 5/1972 | Sinker et al. | 310/339 X |
| 3,666,976 | 5/1972 | Gourlay | 310/330 X |
| 4,005,319 | 1/1977 | Nilsson et al. | 310/339 |
| 4,048,526 | 9/1977 | Taylor | 310/329 |
| 4,307,602 | 12/1981 | Sawada et al. | 310/332 |

Primary Examiner—Mark O. Budd
Attorney, Agent, or Firm—Joseph S. Iandiorio

[57] ABSTRACT

A piezoelectric generator for converting acoustic energy in a predetermined frequency range to electric energy including: a piezoelectric bending element; means for mounting the piezoelectric bending element in an acoustic energy path; tuning means mounted to the piezoelectric bending element to set the resonant frequency of oscillation of the piezoelectric bending element within the predetermined frequency range.

12 Claims, 6 Drawing Figures

PIEZOELECTRIC ACOUSTO-ELECTRIC GENERATOR

FIELD OF INVENTION

This invention relates to a tuned piezoelectric generator for converting acoustic energy to electric energy in a predetermined frequency range.

BACKGROUND OF INVENTION

Modern automobiles have an ever-increasing need for electrical power, due in part to the continual addition of electrical and electronic apparatus of various types for improving engine performance, steering and other functions of the automobile, as well as air-conditioning units, stereo systems and the like. This has placed an increasing demand on the conventional automobile generating system, requiring higher power alternators and generators and consequent higher drain on the engine output, leaving less horsepower available for propelling the automobile.

There is known a piezoelectric power system for converting waste acoustical energy from an aircraft jet engine exhaust into electrical energy, U.S. Pat. No. 3,239,678. There piezoelectrical elements are mounted to be driven in a simple beam mode by the jet exhaust, where the major portion of the acoustic energy occurs in the frequency range between the rotation frequency of the engine and the blade frequency of the turbines, typically several hundred to several thousand Hz. In contrast, the acoustic energy in the exhaust systems of conventional reciprocating piston engines is in the range of the rotation to the piston frequency, namely 50-600 Hz. Unfortunately, the piezoelectric transducers disclosed for use at the higher frequency of jet engine exhaust would be much too large to be practical for resonant operation at frequencies as low as 50-600 Hz. For this reason, piezoelectric generators are not currently in favor for use with automotive engines, even though the engines have become smaller and the power consumed by the electric generator, typically several horsepower, has come to represent an increasing and significant portion of the engine's available power.

SUMMARY OF INVENTION

It is therefore an object of this invention to provide an improved piezoelectric generator for converting acoustic energy to electric energy.

It is a further object of this invention to provide such a piezoelectric generator which may be operated by the acoustic energy in the exhaust of conventional automobile engines.

It is a further object of this invention to provide a tuned piezoelectric generator for converting acoustic energy in a predetermined range to electric energy.

The invention results from the realization that a truly compact and efficient piezoelectric generator can be constructed for converting acoustic energy at low frequencies to electric energy by using a piezoelectric bending element with a tuning device attached to it to set the resonant frequency of oscillation of the piezoelectric bending element to the frequency range of the acoustic energy.

The invention features a piezoelectric generator for converting acoustic energy in a predetermined frequency range to electric energy. There is a piezoelectric bending element and means for mounting the piezoelectric bending element in an acoustic energy path. Tuning means mounted to the piezoelectric bending element sets the resonant frequency of oscillation of the piezoelectric bending element within the predetermined frequency range.

In preferred embodiments, the piezoelectric bending element may be mounted in cantilevered configuration with the tuning means mounted at the free end of the piezoelectric bending element. Alternatively, the piezoelectric bending element may be a disk supported proximate its edge and carrying the tuning mass proximate its center, or supported at the center with the tuning mass near its edge, or supported by the gas containing the acoustic energy which is directed at the disk by a conduit, and the tuning mass may be either at the edge or the center, or both.

The means for mounting may include a conduit which directs at the disk the gas containing the acoustic energy. In the cantilever configuration, tuning means may include a mass or weight, or may include an oscillator member with means supporting the oscillator member in spaced relation to the piezoelectric bending element. The means for supporting the oscillator member may be separate or integral with the oscillator member. The oscillator member may extend in one direction at least part way toward the end of the piezoelectric bending element which is supported by the means for mounting and in the other direction beyond the free end of the piezoelectric bending element. The oscillator member may be generally planar in form. There may also be a fixed member and means for supporting the fixed member in spaced relation to the end of the piezoelectric bending element which is connected with the means for mounting. The fixed member may be separate from or integral with the support member, and the fixed member may extend at least part way toward the free end of the piezoelectric bending element and/or beyond the end of the piezoelectric bending element connected with the means for mounting. The fixed member, too, may be generally planar. Means may be provided for rectifying the electric current produced in the piezoelectric bending element by the acoustical energy.

In particular applications, the invention features a piezoelectrical generator system for converting to electrical energy acoustic energy in a predetermined frequency range propagating along a surface, wherein there are a plurality of piezoelectric generators attached to the surface. Alternatively, a piezoelectric generator system may be mounted to either the inside or outside of a conduit or to the inside or outside of the reciprocating piston engine exhaust conduit.

DISCLOSURE OF PREFERRED EMBODIMENT

Other objects, features and advantages will occur from the following description of the preferred embodiment and the accompanying drawings, in which.

Figure 1:
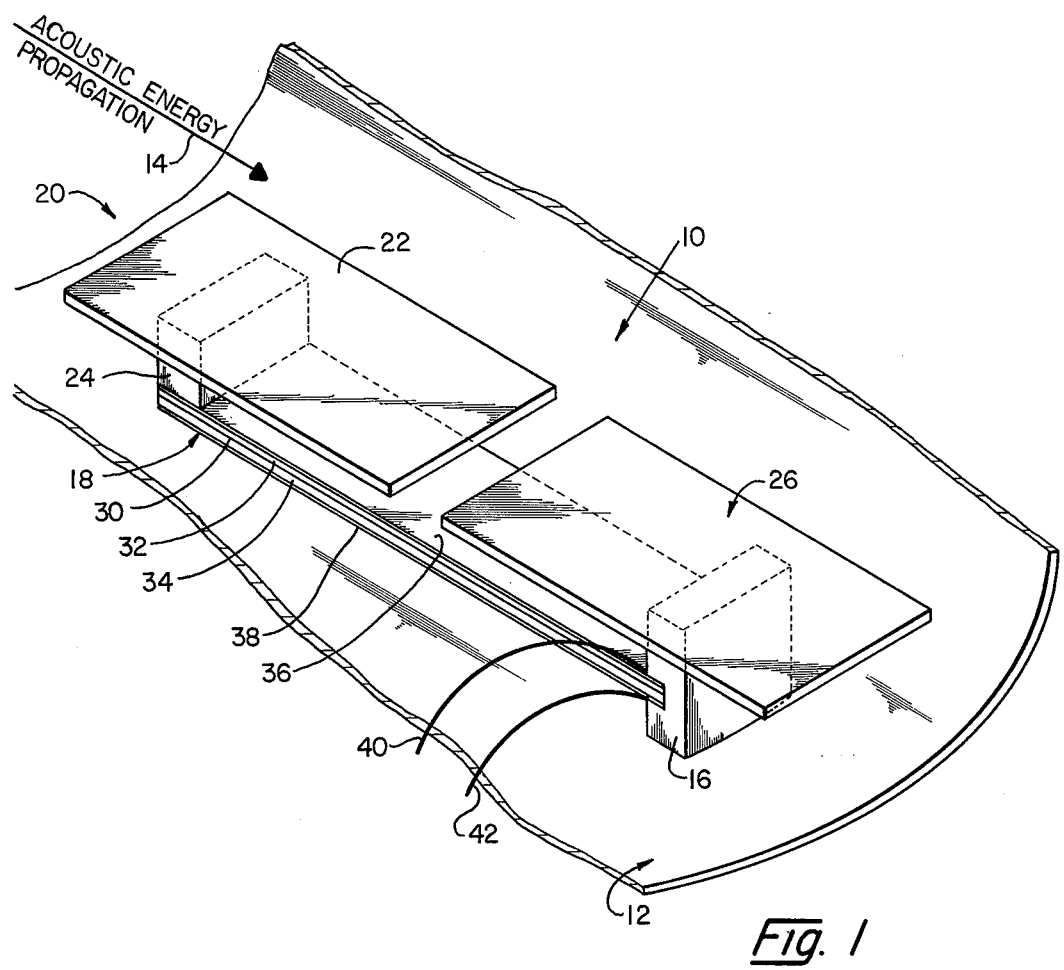
FIG. 1 is an axonometric view of a piezoelectric generator according to this invention.

The invention may be accomplished with a piezoelectric generator, for converting acoustic energy in a predetermined frequency range to electrical energy, for use in the exhaust systems of conventional reciprocating piston engines where the frequency range is approximately 50–600 Hz. The piezoelectric generator includes a piezoelectric bending element and means for mounting that element in an acoustic energy path, namely on a surface over which acoustic energy propagates or on the inner or outer surface of a closed or open conduit through which acoustic energy propagates. In one particular application a plurality of such piezoelectric generators are used in the exhaust system of an automobile having a conventional reciprocating piston internal combustion engine. The generator includes tuning means mounted to the free end of the piezoelectric bending element to set the resonant frequency of oscillation of the piezoelectric bending element within a predetermined frequency range: in the case of conventional automobiles, 50–600 Hz. Tuning means may include simply a mass, or it may include an oscillator member and means for supporting the oscillator member in spaced relation to the piezoelectric bending element. Preferably the oscillator member is a plate. A fixed member is also used; it, too, may be planar, and it covers the remaining portion of the piezoelectric bending element. The two planar elements provide a nearly complete cover to protect the piezoelectric bending element from the exhaust gases.

Alternatively, the bending element may be disk-shaped supported near its edges with the tuning mass near its center, or supported at the center with the tuning mass near its edge, or supported by the gas containing the acoustic energy which is directed at the disk by a conduit, and the tuning mass may be either at the edge or the center, or both.

Typically, the piezoelectric generators are associated with a rectifier circuit which, for example, feeds a battery through a conventional charging circuit.

The piezoelectric bending element used in this invention is also known as a bilaminate, or bilam, or bimorph; namely, a thin, piezoelectric coating applied to both sides of a thin flexible metal blade such as shimstock. The piezoelectric coatings may have electrode layers, made of silver, for example, applied to their outer surfaces. The piezoelectric material is electrically polarized by being heated above its Curie temperature and then cooled below it in the presence of an electric field. The polarization is such that one layer contracts while the other expands when an electric field is applied across the two layers or across each layer independently. A contraction in thickness results in an extension in length. The two are related by Poisson's Ratio. Thus the bilam bends when an electric field is applied. Conversely, when the bilam is bent an electric field is generated. It is this feature of the bilam, or piezoelectric bending element, that is utilized in this invention.

Typically, materials such as barium-titanate and lead zirconate compounds having Curie temperatures above 400° C. may be used. A typical bilam for use in an automobile exhaust may be approximately 2 inches by 2 inches with a thickness of about 0.2 inch with a tuning mass of 0.1 kilogram (0.22 pounds), for resonance at 1 kHz.

There is shown in FIG. 1 a piezoelectric generator 10 according to this invention mounted on a surface 12 over which acoustic energy propagates in the direction indicated by arrow 14. Piezoelectric generator 10 includes mounting block 16 which is fixed to surface 12 and supports in a cantilevered configuration the piezoelectric bending element 18, on the end of which is mounted a tuning mass 20 including an oscillator member, plate 22, and a spacer block 24, which is mounted at or near the free end of bending element 18 and supports oscillator plate 22 in spaced relation to piezoelectric bending element 18. The weight or mass constituting the tuning means 20 may take various forms: the planar form of plate 22 is preferred. A fixed member, such as plate 26, may be mounted at the other end of piezoelectric bending element 18, where it is supported by mounting block 16. Instead of a separate spacer block, mounting member 16 may be simply extended, as shown in FIG. 1, to support plate 26 in spaced relation to piezoelectric bending element 18. Plate 22 may extend beyond the free end of piezoelectric bending element 18 and inwardly to the midpoint, while fixed plate 26 extends somewhat beyond mounting member 16 in one direction and in the other direction extends nearly to oscillator plate 22. In this way the piezoelectric bending element is protected from harmful effects of the air or gases which may be passing over it in some environments. Piezoelectric bending element 18 includes blade 30, centrally located between two piezoelectric layers 32, 34, each of which have on their outer surface electrodes 36, 38, to each of which is connected an electric conductor 40, 42.

Figure 2:
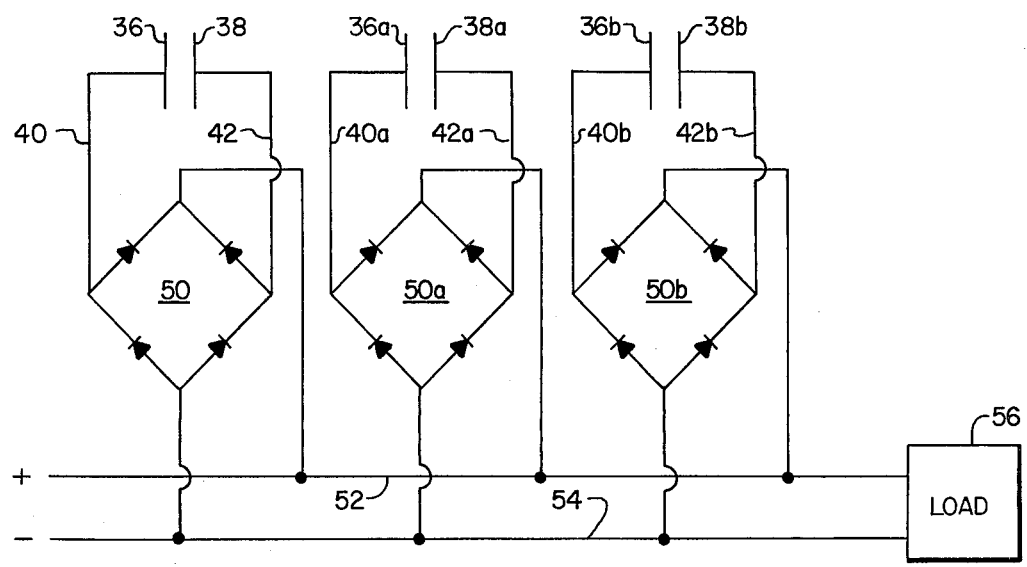
FIG. 2 is a schematic diagram of a rectifier circuit for supplying a load from a plurality of piezoelectric generators according to this invention.

Wires 40, 42 may lead directly to an outside circuit such as rectifier circuits 50, FIG. 2. Rectifier circuit 50 may be formed of a conventional diode bridge whose output is connected across positive, 52, and negative, 54, buses that supply load 56, and are also connected to auxiliary battery and battery charging systems.

Figure 3:
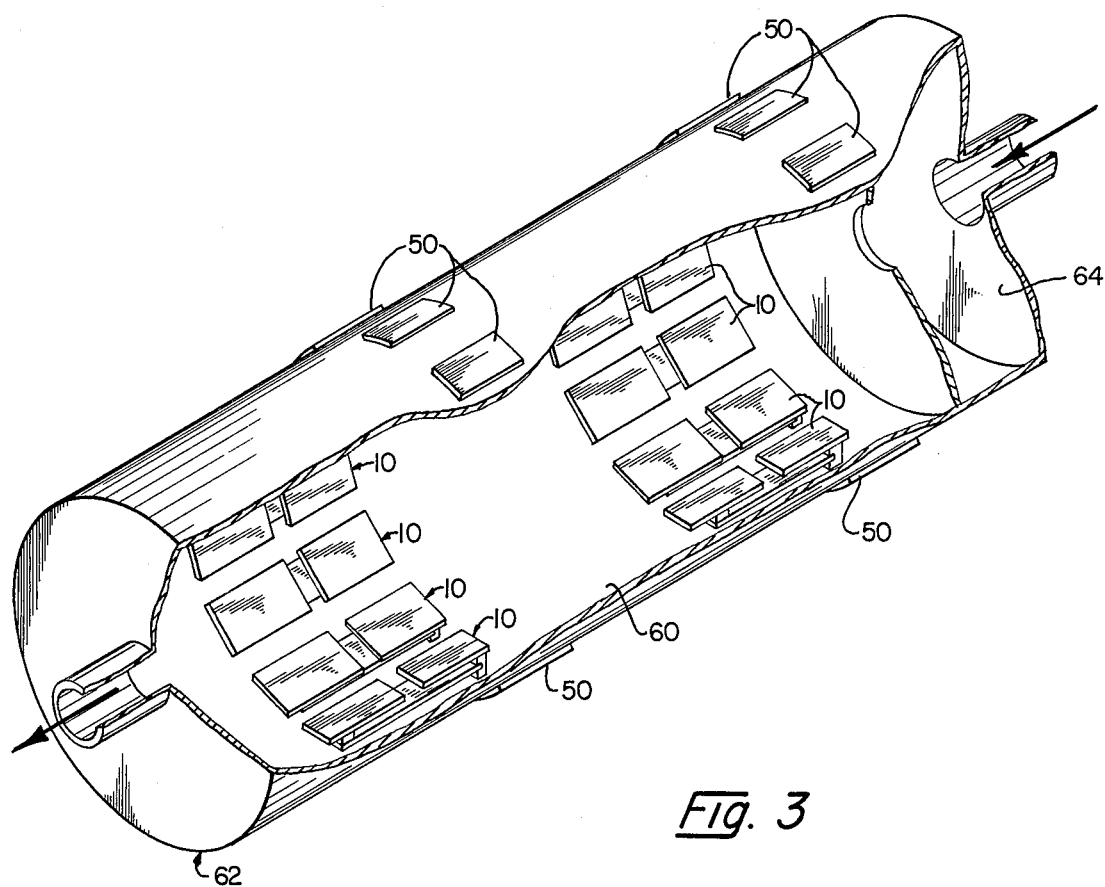
FIG. 3 is a partially broken away axonometric view of an automobile muffler provided with piezoelectric generators according to this invention.

In one application, FIG. 3, a plurality of piezoelectric generators 10 according to this invention are arranged about the inside surface of a chamber 60 of muffler 62, which may be provided downstream from the baffle chamber 64. The associated rectifier circuits 50 may be arranged on the outer surface of muffler 62 opposite the position of their associated piezoelectric generators inside chamber 60. Although piezoelectric generators 10 are shown located on the inside of muffler 62, this is not a necessary limitation of the invention, for as previously indicated they may as well be mounted on the outside.

Although thus far the piezoelectric bending element has been illustrated as elongate and mounted in cantilever configuration, this is not a necessary limitation of the invention. For example, the bending element may have the form of a disk of elastic sheet metal, coated on both sides with piezoelectric layers. Such elements have the advantage of being inherently more compact and of oscillating at higher resonant frequencies which may be a multiple of the driving frequency. At a higher oscillating frequency there is more energy generated per unit mass of piezoelectric ceramic.

Figure 4:
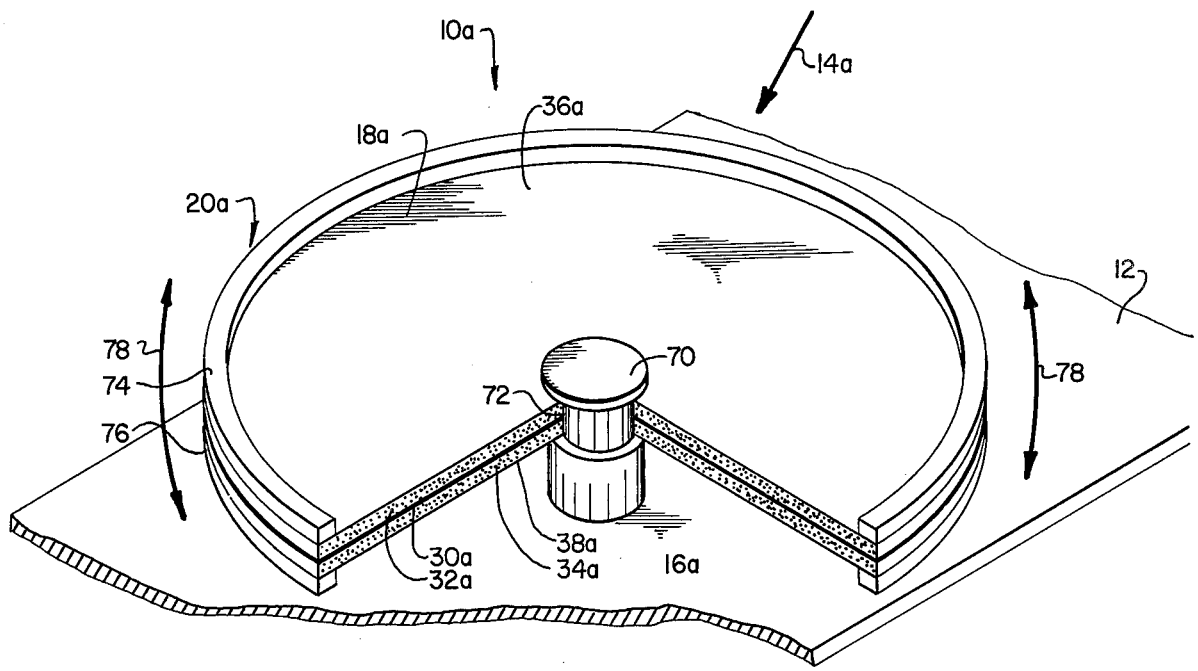
FIG. 4 is a diagrammatic view of a center-mounted disk-shaped piezoelectric generator according to this invention with portions broken away.

A disk-shaped piezoelectric generator 10a, FIG. 4, according to this invention is mounted on the surface 12a over which acoustic energy propagates in the direction indicated by arrow 14a. Piezoelectric generator 10a includes mounting block 16a which receives a rivet or screw 70 in hole 72 to mount piezoelectric bending element disk 18a. Tuning mass 20a may include one or two washers 74, 76 to tune the resonant frequency of the device to the effective range in which it oscillates in the direction indicated by arrows 78. Piezoelectric bending element 18a includes an elastic sheet metal member 30a disposed between the two piezoelectric layers 32, 34, each of which on their outer surface carries electrode material 36a and 38a.

Figure 5:
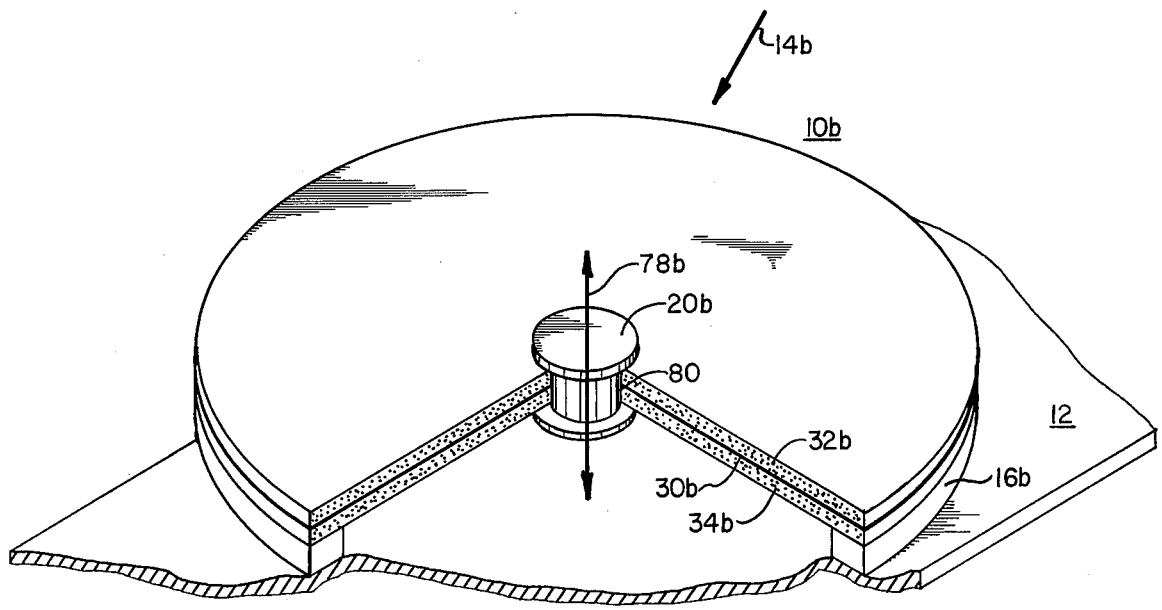
FIG. 5 is a view similar to FIG. 4 of an edge-mounted piezoelectric generator.
Figure 6:
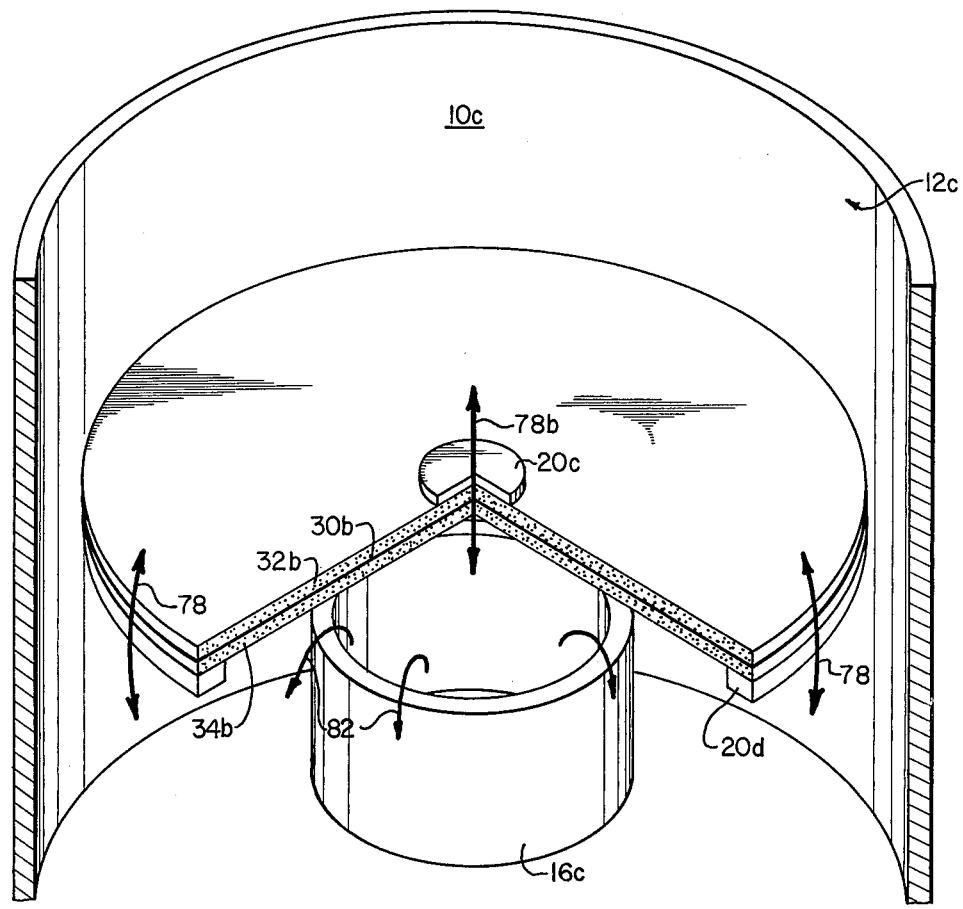
FIG. 6 is a view similar to FIG. 4 of an unconstrained or free-mounted disk-shaped piezoelectric generator according to this invention.

Alternatively, as shown in FIG. 5, disk 10b may be mounted by means of peripheral ring 16b to surface 12 and contain in it its center a tuning mass or device 20b mounted in hole 80 to tune the resonant frequency of disk 10b to the most effective range. Disk 10c, FIG. 6, may be mounted in a wholly unconstrained manner on top of conduit 16c, from which the exhaust exhaust gas carrying the acoustic energy is directed against the underside of disk 10c. As explained by Bernoulli's principle, the constricted gas flow, arrows 82, over the edge of mounting conduit 16c, drives the disk to oscillate in the same manner as previously, as indicated by arrows 78, 78b. Tuning mass 20c in the form of a small disk or a spot of metal 20c, or an annular rim 20d, or both, may be applied to tune the resonant frequency of the disk to the most desirable range.

Other embodiments will occur to those skilled in the art and are within the following claims:

What is claimed is:

1. A piezoelectric generator system for converting acoustic energy in a predetermined frequency range to electric energy, comprising: a piezoelectric bending element; means for mounting said piezoelectric bending element in cantilevered configuration in an acoustic energy path; a planar member and means for supporting said planar member on the free end of said piezoelectric bending element in spaced relation to said piezoelectric bending element, whereby said planar member sets the resonant frequency of oscillation of said piezoelectric bending element within said predetermined frequency range.

2. The piezoelectric generator of claim 1 in which said means for supporting includes a separate support member.

3. The piezoelectric generator of claim 1 in which said oscillator member extends at least part way toward the end of said piezoelectric bending element supported with said means for mounting.

4. The piezoelectric generator of claim 1 in which said oscillator member extends beyond the free end of said piezoelectric bending element.

5. The piezoelectric generator of claim 1 further including a fixed member and means for supporting said fixed member in spaced relation to the end of said pieoelectric bending element connected with said means for mounting.

6. The piiezoelectric generator of claim 5 in which said means for supporting includes a separate support member.

7. The piezoelectric generator of claim 5 in which said fixed member extends at least part way toward the free end of said piezoelectric bending element.

8. The piezoelectric generator of claim 5 in which said fixed member extends at least part way beyond the end of said piezoelectric bending element connected with said means for mounting.

9. The piezoelectric generator of claim 5 in which said fixed member is generally planar.

10. A piezoelectric generator system for converting to electric energy acoustic energy in a predetermined frequency range propagating along a surface, comprising: a plurality of piezoelectric generators each including: a piezoelectric bending element; means for mounting said piezoelectric bending element in cantilever configuration in an acoustic energy path; a planar member and means for supporting said planar member on the free end of said piezoelectric bending element in spaced relation to said piezoelectric bending element, whereby said planar member sets the resonant frequency of oscillation of said piezoelectric bending element within said predetermined frequency range.

11. A piezoelectric generator system for converting to electric energy acoustic energy in a predetermined frequency range propagating along a conduit, comprising: a plurality of piezoelectric generators each including: a piezoelectric bending element; means for mounting said piezoelectric bending element in cantilever configuration in an acoustic energy path; a planar member and means for supporting said planar member on the free end of said piezoelectric bending element in spaced relation to said piezoelectric bending element, whereby said planar member sets the resonant frequency of oscillation of said piezoelectric bending element within said predetermined frequency range.

12. A piezoelectric generator system for converting to electric energy acoustic energy in a predetermined frequency range propagating along a reciprocating piston engine exhaust conduit, comprising: a plurality of piezoelectric generators each including: a piezoelectric bending element; means for mounting said piezoelectric bending element in cantilever configuration in an acoustic energy path; a planar member and means for supporting said planar member on the free end of said piezoelectric bending element in spaced relation to said piezoelectric bending element, whereby said planar member sets the resonant frequency of oscillation of said piezoelectric bending element within said predetermined frequency range.

* * * * *